United States Patent
Cha

(10) Patent No.: US 7,362,043 B2
(45) Date of Patent: Apr. 22, 2008

(54) PLASMA DISPLAY PANEL HAVING A GROUNDING STRUCTURE OF A FILM TYPE FRONT SURFACE FILTER

(75) Inventor: Hong Rae Cha, Seoul (KR)

(73) Assignee: LG Electronics Inc., Seoul (KR)

( * ) Notice: Subject to any disclaimer, the term of this patent is extended or adjusted under 35 U.S.C. 154(b) by 119 days.

(21) Appl. No.: 10/696,996

(22) Filed: Oct. 31, 2003

(65) Prior Publication Data

US 2004/0090182 A1    May 13, 2004

(30) Foreign Application Priority Data

Nov. 1, 2002   (KR) .................. 10-2002-0067436

(51) Int. Cl.
*H01J 64/40*   (2006.01)
(52) U.S. Cl. .................. 313/112; 313/582; 313/583
(58) Field of Classification Search ........ 313/582–587, 313/112, 512
See application file for complete search history.

(56) References Cited

U.S. PATENT DOCUMENTS

| 6,229,085 B1 * | 5/2001 | Gotoh et al. ............... 174/353 |
| 6,255,778 B1 * | 7/2001 | Yoshikawa et al. ......... 313/582 |
| 6,259,505 B1 * | 7/2001 | Makino ..................... 349/153 |
| 6,686,536 B2 * | 2/2004 | Tone et al. ............ 174/35 MS |
| 6,965,191 B2 * | 11/2005 | Koike et al. ................. 313/112 |

* cited by examiner

*Primary Examiner*—Joseph L. Williams
*Assistant Examiner*—Hana Asmat Sanei
(74) *Attorney, Agent, or Firm*—Ked & Associates, LLP

(57) ABSTRACT

Disclosed is a plasma display panel including: a panel; a film type front surface filter disposed at a front surface of the panel; a back cover disposed at a rear surface of the panel; a filter support having a portion thereof formed to be overlapped with the film type front surface filter, for connecting the film type front surface filter with the back cover; a first metallic layer formed on a surface overlapped with the filter support of the film type front surface filter; and a second metallic layer disposed between the first metallic layer and the filter support, for electrically connecting the first metallic layer with the filter support.

48 Claims, 7 Drawing Sheets

30

| Anti-reflection coating film | ~50 |
|---|---|
| Light-characteristic film | ~52 |
| Glass | ~54 |
| EMI shield film | ~56 |
| NIR shield film | ~58 |

Fig.5
Related Art
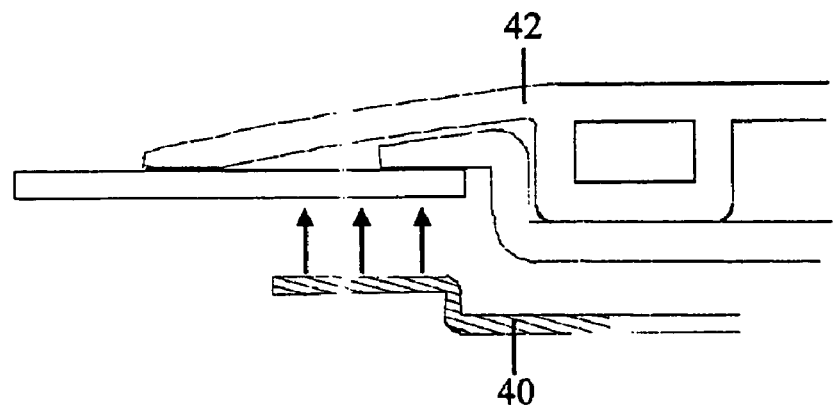
Fig.6
Related Art
60
| Anti-reflection coating film | ~62 |
| --- | --- |
| Light-characteristic film | ~64 |
| EMI shield film | ~66 |
| NIR shield film | ~68 |
Fig.7
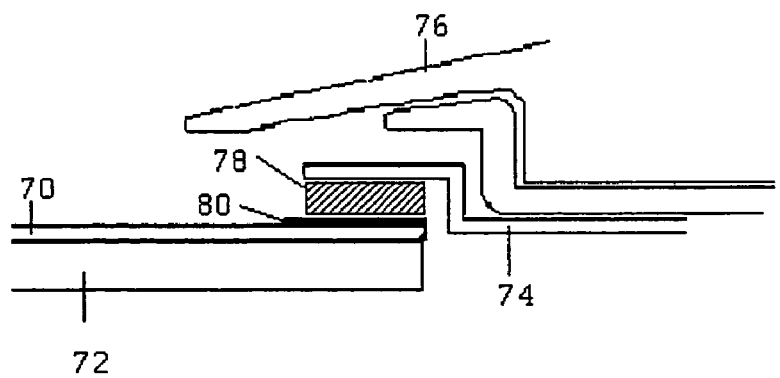

PLASMA DISPLAY PANEL HAVING A GROUNDING STRUCTURE OF A FILM TYPE FRONT SURFACE FILTER

BACKGROUND OF THE INVENTION

1. Field of the Invention

The present invention relates to a plasma display panel, and more particularly, to a plasma display panel in which a grounding method suitable for a film type front surface filter is provided.

2. Background of the Prior Art

A plasma display panel (hereinafter, referred to as "PDP") radiates phosphors by using an ultraviolet ray having a wavelength of 147 nm generated when mixed inert gas such as He+Xe, Ne+Xe, He+Ne+Xe and the like is discharged, so that an image including a letter or a graph is displayed thereon. It is easy to make the PDP thin and large-sized. In addition, a recent technology development attributes to an improved image quality. In particular, a three-electrode alternating current (AC) surface discharge type PDP has an advantage of a low voltage operation and a long lifetime, since wall charges are accumulated on a surface thereof at the time of discharge and electrodes are protected from a sputtering generated by the discharge.

FIG. 1 is a perspective view illustrating a structure of a discharge cell of a conventional three-electrode AC surface discharge type PDP.

Referring to FIG. 1, the discharge cell of the three-electrode AC surface discharge type PDP includes a scan electrode Y and a sustain electrode Z formed on an upper substrate 10, and an address electrode X formed on a lower substrate 18. The scan electrode Y and the sustain electrode Z respectively include transparent electrodes 12Y and 12Z, and metallic bus electrodes 13Y and 13Z having line widths narrower than the transparent electrodes 12Y and 12Z and being formed at one-side edges of the transparent electrodes.

The transparent electrodes 12Y and 12Z are generally formed of Indium-Tin-Oxide (ITO) on the upper substrate 10. The metallic bus electrodes 13Y and 13Z are generally formed of Chromium (Cr) on the transparent electrodes 12Y and 12Z to function to reduce a voltage drop caused by a high resistance of the transparent electrodes 12Y and 12Z. An upper dielectric layer 14 and a passivation layer 16 are stacked on the upper substrate 10 in which the scan electrode Y and the sustain electrode Z are formed in parallel with each other. The wall charges generated at the time of the plasma discharge are accumulated on the upper dielectric layer 14. The passivation layer 16 prevents the upper dielectric layer 14 from being damaged due to the sputtering generated at the time of the plasma discharge. In addition, the passivation layer 16 increases an efficiency of secondary electron emission. Magnesium Oxide (MgO) is generally used for the passivation layer 16.

A lower dielectric layer 22 and a barrier rib 24 are formed on the lower substrate 18 in which the address electrode X is formed, and a phosphor layer 26 is coated on surfaces of the lower dielectric layer 22 and the barrier rib 24. The address electrode X is formed in a crossing direction of the scan electrode Y and the sustain electrode Z. The barrier rib 24 is formed in a stripe or grid shape to prevent an ultraviolet ray and a visible rays created by the discharges from being leaked into adjacent discharge cells. The phosphor layer 26 is excited by the ultraviolet ray in the plasma discharge to generate any one of visible rays of red, green and blue. The mixed inert gas is injected into a discharge space provided between the upper/lower substrates 10 and 18 and the barrier rib 24.

In order to implement a gray scale of an image, the PDP divides one frame into several sub-fields having different radiation times and operates in a time division driving method. Referring to FIG. 2, each of the sub-fields is divided into a reset period for resetting an entire screen, an address period for selecting a scan line and selecting a cell from the selected scan line, and a sustain period for implement the gray scale depending on discharge times.

For instance, in case it is intended to display a 256 gray scale image, as shown in FIG. 2, a frame period (16.67 ms) corresponding to $\frac{1}{60}$ second is divided into eight sub-fields SF1 to SF8. As described above, each of the eight sub-fields SF1 to SF8 is divided into the reset period, the address period and the sustain period. The reset period and the address period for each of the sub-fields are the same every sub-field, while the sustain period increases at a rate of $2^n$ (n=0, 1, 2, 3, 4, 5, 6, 7) in each of the sub-fields.

In the PDP that is driven as above, a front surface filter is disposed on the upper substrate 10 in order to shield an electromagnetic interference and to prevent reflection of an external light.

FIG. 3 is a schematic sectional view showing one side of the conventional PDP.

Referring to FIG. 3, the conventional PDP includes a panel 32 formed by adhering the upper substrate to the lower substrate; a front surface filter 30 disposed at a front surface of the panel 32; a heat sink 34 disposed at a rear surface of the panel 32; a printed circuit board 36 disposed to be adhered to the heat sink 34; a back cover 38 formed to encompass a rear surface of the PDP; a filter support 40 for connecting the front surface filter 30 with the back cover 38; and a support member 42 (or a front cover) disposed between the front surface filter 30 and the back cover 38 to encompass the filter support 40.

The printed circuit board 36 supplies a driving signal to the electrodes of the panel 32. For this, the printed circuit board 36 includes various driving parts (not shown). The panel 32 displays a predetermined image in response to the driving signal supplied from the printed circuit board 36. The heat sink 34 dissipates a heat that is generated from the panel 32 and the printed circuit board 36. The back cover 38 protects the panel 32 from an external impact and shields the electromagnetic interference (hereinafter, referred to as "EMI") emitted toward the rear surface of the PDP.

The filter support 40 electrically connects the front surface filter 30 to the back cover 38. The filter support 40 grounds the front surface filter 30 to the back cover 38 and also prevents the EMI from being emitted toward a lateral surface of the PDP. The support member 42 supports the filter support 40, the front surface filter 30 and the back cover 38, etc.

The front surface filter 30 shields the EMI and also prevents the reflection of the external light. For this, as shown in FIG. 4, the front surface filter 30 includes an antireflection coating film 50, a light-characteristic film 52, a glass 54, an EMI shield film 56 and a near infrared ray (hereinafter, referred to as "NIR") shield film 58. Herein, an adhesive layer is substantially formed between respective films 50, 52, 54, 56 and 58 of the front surface filter 30 to adhere the respective films 50, 52, 54, 56 and 58 to one another. Further, the light-characteristic film 52 is generally formed by addition of a specific material to the adhesive layer. Furthermore, the structure of the front surface filter 30 is slightly altered according to a manufacturer thereof. In the present invention, for the sake of convenience, the adhesive layer is not shown, the light-characteristic film 52 is represented as the specific layer, and the structure of the front surface filter 30 generally used is exemplified.

The anti-reflection coating film 50 prevents an external incident light from being reflected toward the external to improve a contrast of the PDP. The above-described antireflection coating film 50 is formed at a surface of the front surface filter 30. On the other hand, the anti-reflection coating film 50 can be additionally formed at a rear surface of the front surface filter 30. The light-characteristic film 52 decreases a brightness of red (R) and green (G) and also increases the brightness of blue (B) among an incident light from the panel 32 to improve a light characteristic of the PDP.

The glass 54 prevents the front surface filter 30 from being damaged by the external impact. In other words, the glass 54 supports the front surface filter 30 so as to prevent the front surface filter 30 from being damaged by the external impact. The EMI shield film 56 shields the EMI to prevent an incident EMI from the panel 32 from being emitted toward the external. The NIR shield film 58 shields the NIR incident from the panel 32. The NIR shield film 58 prevents the NIR exceeding a reference value from being emitted toward the external such that transmission signals from a remote controller to the panel 32 can be normally transmitted. Meanwhile, the EMI shield film 56 and the NIR shield film 58 can be provided with one layer.

As shown in FIG. 5, the front surface filter 30 is electrically connected with the back cover 38 through the filter support 40. In more detail, the filter support 40 is connected to the rear surface of the front surface filter 30 at one side end thereof. At this time, the filter support 40 is electrically connected with at least one of the EMI shield film 56 and the NIR shield film 58. In other words, the filter support 40 connects the front surface filter 30 to the back cover 38 to thereby shield the EMI and/or the NIR.

In the conventional front surface filter 30, the glass 54 is used to prevent the front surface filter 30 from being damaged by the external impact. However, the front surface filter 30 has a disadvantage of increasing a thickness if the glass 54 is inserted into the front surface filter 30 as described above; Further, if the glass 54 is inserted into the front surface filter 30, the front surface filter 30 has a disadvantage in that the PDP becomes heavy and a manufacture cost increase as well.

Accordingly, there has been proposed a film type front surface filter 60 in which the glass 54 is removed as shown in FIG. 6. A film type front surface filter 60 includes an antireflection coating film 62, a light-characteristic film 64, an EMI shield film 66 and a NIR shield film 68. Herein, an adhesive layer is formed between respective films 62, 64, 66, 68 of the film type front surface filter 60 to adhere the respective films 62, 64, 66 and 68 to one another. Additionally, a light-characteristic film 64 is generally formed by addition of the specific material to the adhesive layer. Further, a structure of the film type front surface filter 60 is slightly altered according to a using company. For the sake of convenience, the adhesive layer is not shown and the light-characteristic film 64 is represented as the specific layer.

The anti-reflection coating film 62 is formed on a surface of the film type front surface filter 60 to prevent an external incident light from being reflected toward the exterior. The anti-reflection coating film 62 can be additionally formed at the rear surface of the film type front surface filter 60. The light-characteristic film 64 decreases the brightness of red (R) and green (G) and increases the brightness of blue (B) among the incident light from the panel 32 to improve the light characteristic of the PDP.

The EMI shield film 66 shields the EMI so that the incident EMI can be prevented from the panel 32 from being emitted toward the exterior. The NIR shield film 68 shields the incident NIR from the panel 32. The NIR shield film 68 prevents the NIR exceeding the reference value from being emitted toward the exterior such that signals can be normally transmitted from the remote controller and the like to the panel 32. Meanwhile, the EMI shield film 66 and the NIR shield film 68 can be provided with one layer.

Compared with the front surface filter 30 with the glass 54, the film type front surface filter 60 can be made thinly and lightly. Further, the film type front surface filter 60 can reduce the manufacturing cost in comparison with the front surface filter 30 with the glass 54. However, there has not been proposed a method for grounding between the film type front surface filter 60 and the filter support 40 when the film type front surface filter 60 is disposed at the PDP.

SUMMARY OF THE INVENTION

Accordingly, the present invention is directed to a plasma display panel that substantially obviates one or more problems due to limitations and disadvantages of the related art.

It is an object of the present invention to provide a plasma display panel which is capable of providing a grounding method suitable for a film type front surface filter.

To achieve these objects and other advantages and in accordance with the purpose of the invention, as embodied and broadly described herein, there is provided a plasma display panel including: a panel; a film type front surface filter disposed at a front surface of the panel; a back cover disposed at a rear surface of the panel; a filter support having a portion formed to be overlapped with the film type front surface filter, for connecting the film type front surface filter with the back cover; a first metallic layer formed on a surface overlapped with the filter support of the film type front surface filter; and a second metallic layer disposed between the first metallic layer and the filter support, for electrically connecting the first metallic layer with the filter support.

In another aspect of the present invention, there is provided a plasma display panel including: a panel; a film type front surface filter disposed at a front surface of the panel to have a wider area than the panel; a back cover disposed at a rear surface of the panel; a filter support for electrically connecting the film type front surface filter with the back cover; a support member disposed to encompass a portion of the film type front surface filter and the filter support, and connected to the back cover; and a metallic layer formed to encompass a surface of the film type front surface filter being not overlapped with the panel.

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this application, illustrate embodiments of the present invention and together with the description serve to explain the principle of the present invention. In the drawings:

FIG. 5 is a detailed view illustrating a grounding procedure of a front surface filter and a filter support shown in FIG. 3;

FIG. 6 is a schematic sectional view of a conventional film type front surface filter;

FIG. 7 is a sectional view of a plasma display panel according to an embodiment of the present invention;

DETAILED DESCRIPTION OF THE PREFERRED EMBODIMENTS

Figure 1:
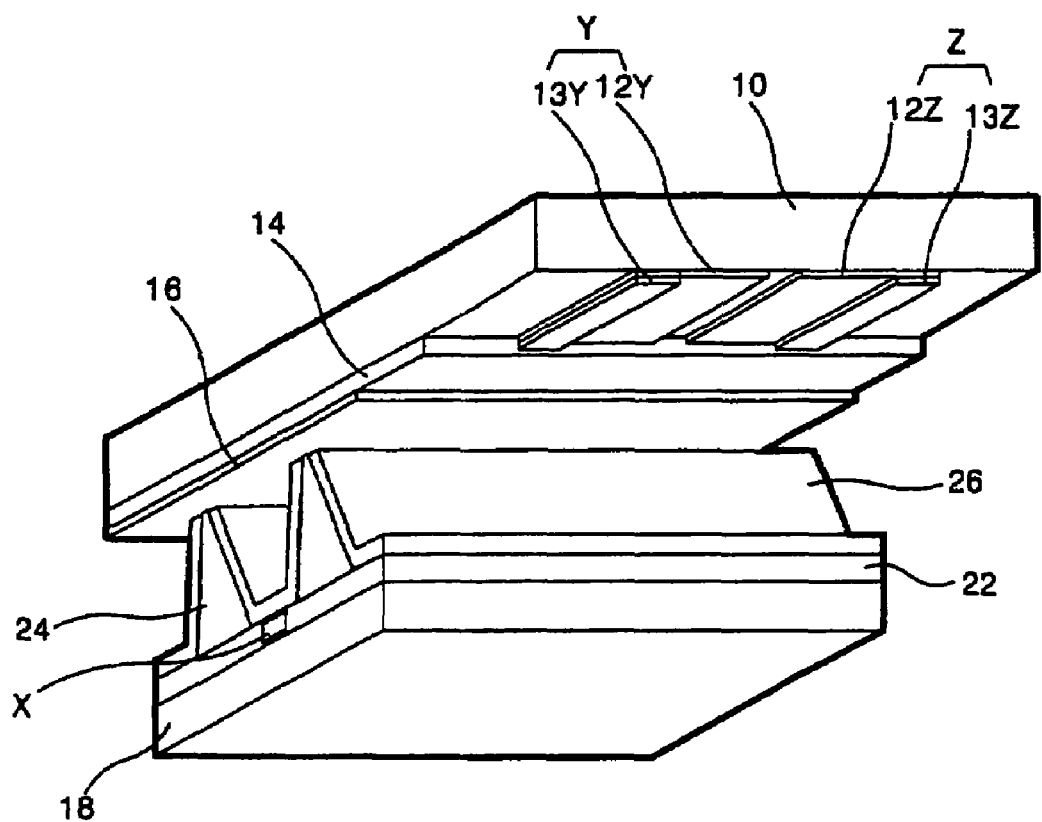
FIG. 1 is a perspective view illustrating a structure of a discharge cell of a conventional three-electrode AC surface discharge type PDP.
Figure 2:
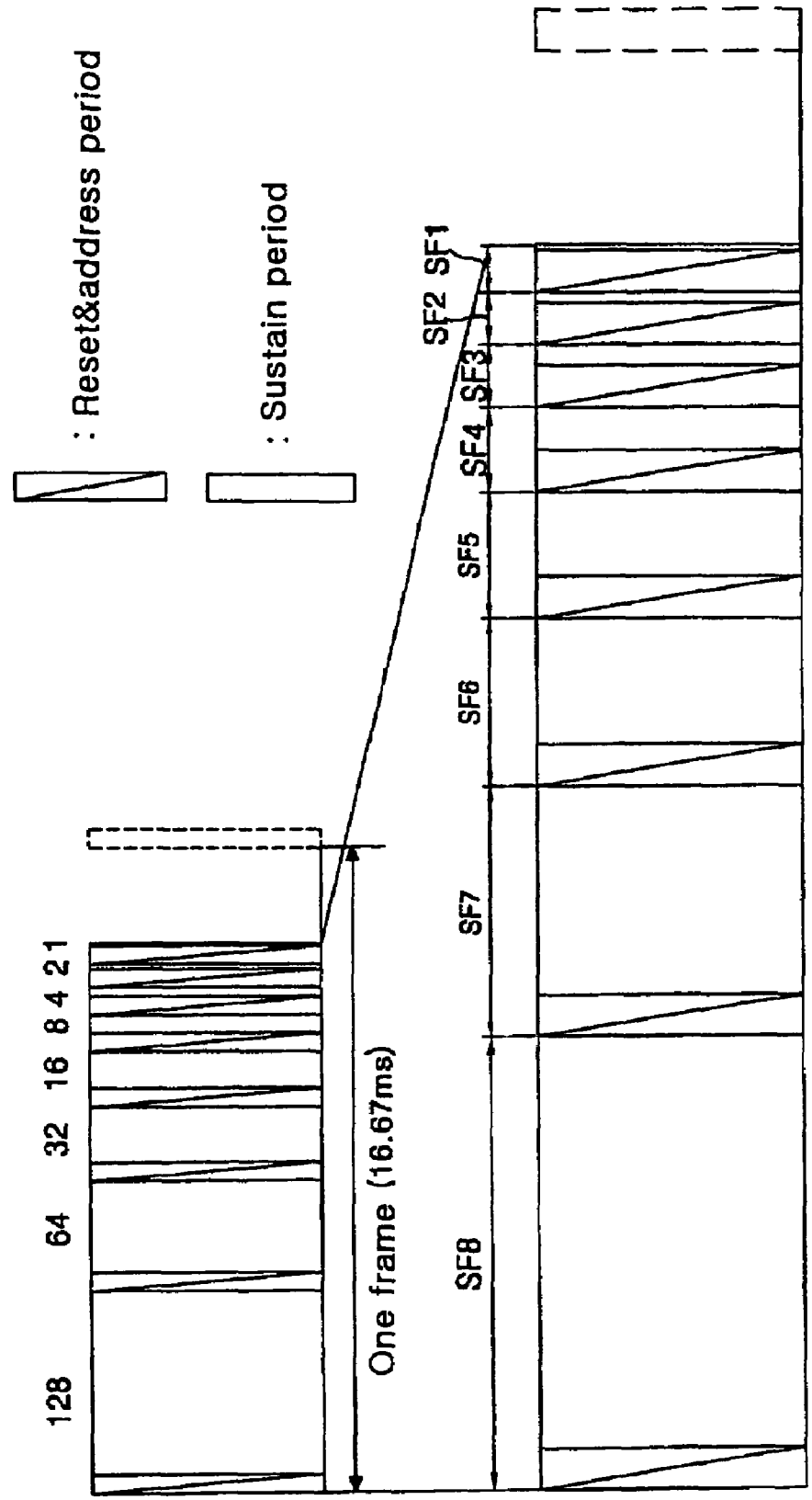
FIG. 2 is a view illustrating a frame for representing 256 gray scales in a conventional PDP.

Reference will now be made in detail to a preferred embodiment of the present invention.

FIG. 7 is a sectional view of a plasma display panel (PDP) according to an embodiment of the present invention.

Referring to FIG. 7, the PDP according to a first embodiment of the present invention includes a panel 72 formed by adhering the upper substrate to the lower substrate and a flim type front surface filter 70 disposed at a front surface of the panel 72. A heat sink (not shown), a printed circuit board (not shown) and a back cover 38 (shown in FIG. 11) formed to encompass a rear surface of the PDP are disposed at a rear surface of the panel 72. Further, the PDP according to the first embodiment of the present invention includes a filter support 74 for electrically connecting the film type front surface filter 70 with the back cover, and a support member 76 disposed between the film type front surface filter 70 and the back cover 38 to encompass the filter support 74.

The panel 72 displays a predetermined image in response to a driving signal supplied from the printed circuit board. The heat sink dissipates a heat generated from the panel 72 and the printed circuit board. The back cover protects the panel 72 from the external impact and also shields the EMI emitted toward the rear surface of the PDP.

The filter support 74 electrically connects the film type front surface filter 70 to the back cover, and also shields the EMI emitted toward the lateral surface of the PDP. The support member 76 supports the filter support 74 and the back cover.

The film type front surface filter 70 shields the EMI emitted toward the front surface of the PDP and also prevents reflection of an external light. Further, the film type front surface filter 70 decreases a brightness of red (R) and green (G) and also increases the brightness of the blue (B) to improve a light characteristic of the PDP. Additionally, the film type front surface filter 70 shields the NIR to prevent an erroneous operation of the remote controller. A structure of the inventive film type front surface filter 70 is the same as that of the conventional film type front surface filter 60 shown in FIG. 6.

On the other hand, an end of the filter support 74 is overlapped with an end of the film type front surface filter 70 to be electrically connected with the film type front surface filter 70. At this time, at the end of the film type front surface filter 70 overlapped with the filter support 74 is formed a first metallic layer 80. The first metallic layer 80 is electrically connected with at least one of a NIR shield film and an EMI shield film of the film type front surface filter 70. Herein, a second metallic layer 78 is disposed between the first metallic layer 80 and the end of the filter support 74. The second metallic layer 78 electrically connects the film type front surface filter 70 with the filter support 74.

In other words, in the embodiment of the present invention, the first metallic layer 80 formed on the end of the film type front surface filter 70 and the second metallic layer 78 disposed between the first metallic layer 80 and the end of the filter support 74 are used to connect the film type front surface filter 70 with the filter support 74. On the other hand, as the second metallic layer 78, a fringe spring gasket or a shielding foam gasket being now much used as a conductive connection material can be used. Accordingly, the second metallic layer 78 is disposed in various shapes depending on a kind of the used gasket to connect the film type front surface filter 70 with the filter support 74. On the other hand, since the finger spring gasket and the shielding foam gasket have a certain elasticity, it can absorb the impact applied from the exterior to the film type front surface filter 70 to thereby prevent a damage of the film type front surface filter 70. That is, a material having the certain elasticity is selected for the second metallic layer 78 used in the present invention to connect the film type front surface filter 70 with the filter support 74, and the impact applied from the exterior is absorbed to prevent the damage of the film type front surface filter 70.

Figure 8:
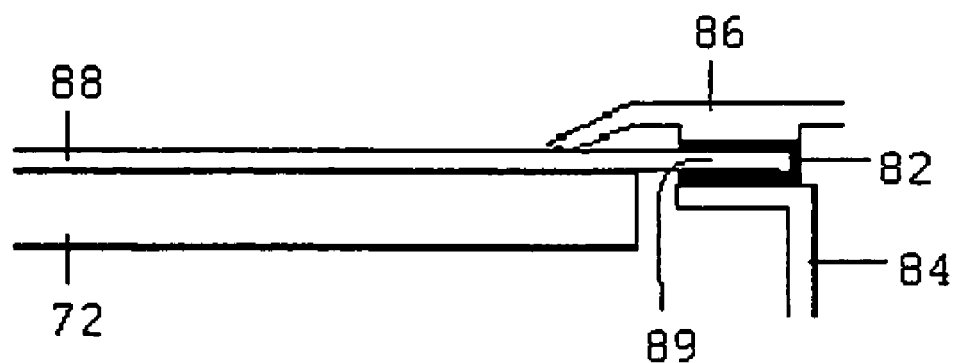
FIG. 8 is a sectional view of a plasma display panel according to a second embodiment of the present invention.

FIG. 8 is a sectional view of a plasma display panel according to second embodiment of the present invention.

Referring to FIG. 8, the PDP according to second embodiment of the present invention includes a panel 72 formed by adhering an upper substrate to a lower substrate and a film type front surface filter 88 disposed at a front surface of the panel 72. A heat sink (not shown), a printed circuit board and a back cover formed to compass a rear surface of the PDP are formed at a rear surface of the panel 72. Further, the PDP according to second embodiment of the present invention includes a filter support 84 for electrically connecting the back cover with a film type front surface filter 88, and a support member 86 disposed between the film type front surface filter 88 and the back cover to encompass the filter support 84.

The film type front surface filter 88 is formed to have a wider area than the panel 72. Accordingly, the film type front surface filter 88 is protruded at one side toward a region besides the panel 72. That is, the one side of the film type front surface filter 88 is not overlapped with the panel 72. As described above, a metallic layer 82 is formed to encompass the one side 89 of the front filter 88 not overlapped with the panel 72. The metallic layer 82 is electrically connected with at least one of a NIR shield film and an EMI shield film. On the other hand, the metallic layer 82 is disposed between the support member 86 and the filter support 84. Herein, the metallic layer 82 is electrically connected with the filter support 84. That is, the filter support 84 is electrically connected with the film type front surface filter 88 via the metallic metal 82.

In other words, in this embodiment, the film type front surface filter 88 is large-sized more than the panel 72, and the metallic layer 82 is formed to encompass the one side 89 of the film type front surface filter 88 which is not overlapped with the panel 72, such that the filter support 84 is electrically overlapped with the film type front surface filter 88. Accordingly, the film type front surface filter 88 can be stably connected to the filter support 84.

Figure 9:
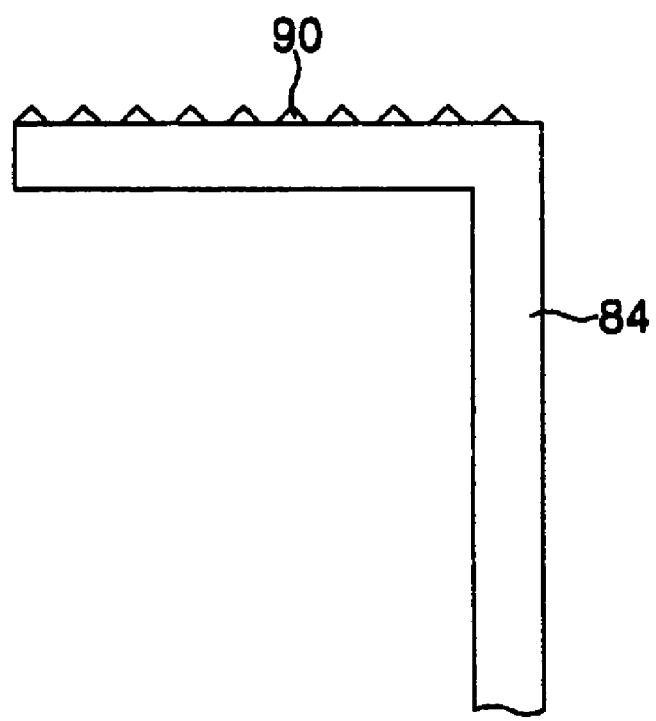
FIG. 9 is a view of a protrusion formed at a filter support shown in FIG. 8.
Figure 10:
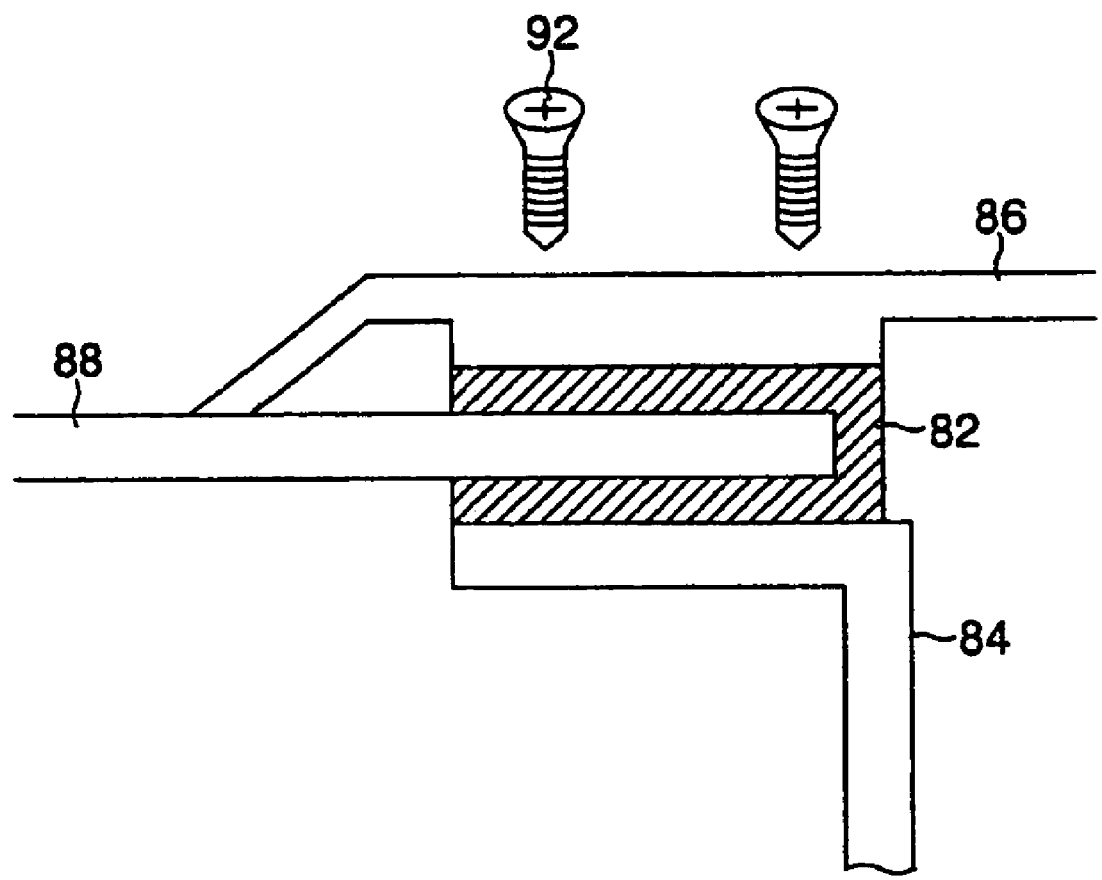
FIG. 10 is a sectional view illustrating a fixing procedure of a filter support, a film type front surface filter and a support member according to second embodiment of the present invention.

FIG. 9 is a view of a protrusion formed at a filter support shown in FIG. 8, and FIG. 10 is a sectional view illustrating a fixing procedure of a filter support, a film type front surface filter and a support member according to another embodiment of the present invention.

Figures 3, 4:
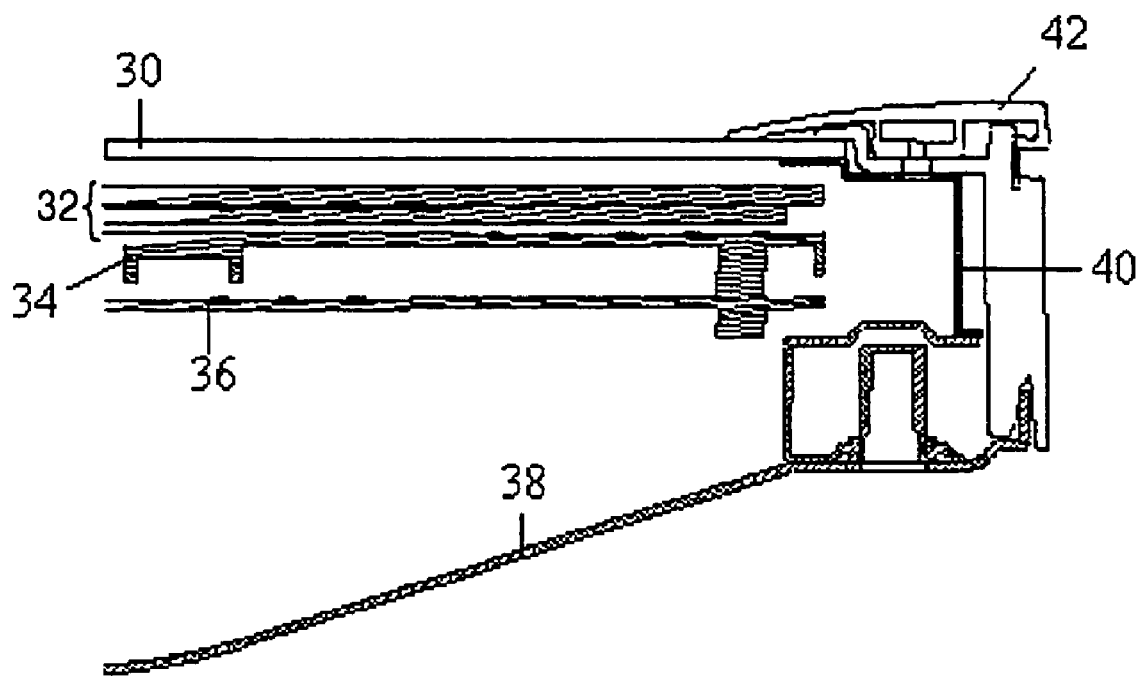
FIG. 3 is a schematic sectional view illustrating one side of a conventional PDP.
FIG. 4 is a schematic sectional view of a front surface filter shown in FIG. 3.
Figure 11:
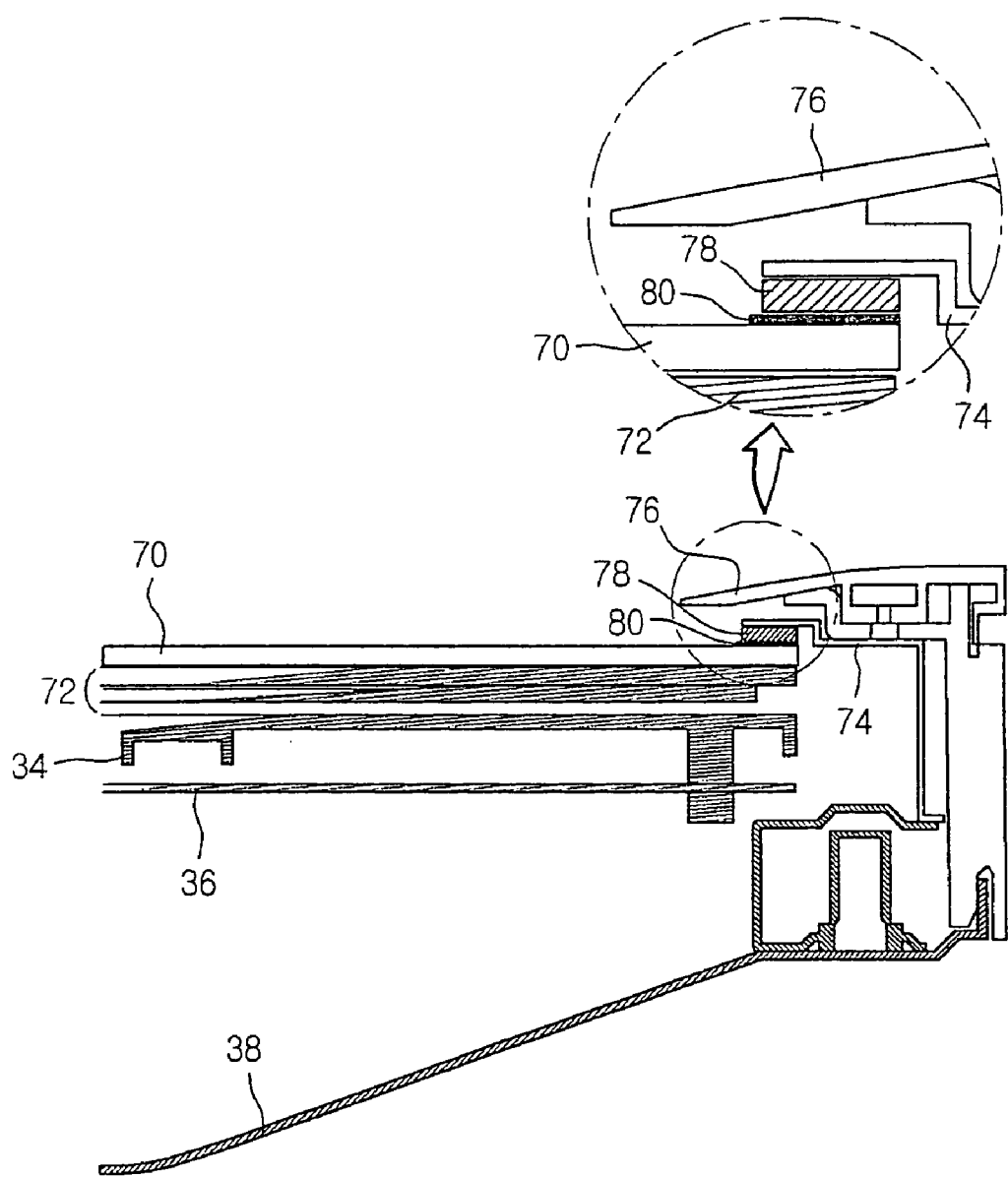
FIG. 11 is a sectional view of a plasma display panel with a back cover according to an embodiment of the present invention.

On the other hand, in the second embodiment of the present invention, as shown in FIG. 9, at a surface having the metallic layer 82 and the filter support 84 connected to each other, that is, at an end of the filter support 84 is formed a plurality of protrusions 90 such that a contact resistance can be reduced between the metallic layer 82 and the filter support 84. Additionally, in the present invention, as shown in FIG. 10, the support member 86, the metallic layer 82 and the filter support 84 can be fixed using at least one screw 92 for passing through the support member 86, the metallic layer 82 and the filter support 84. Herein, the support member 86, the metallic layer 82 and the filter support 84 respectively have at least one hole (not shown) for allowing insertion of the screw 92. Finally, FIG. 11 shows an embodiment of the present invention with a back cover 38 spaced from and disposed in a backward position of the panel. The structure of the back cover 38 is similar to that shown in FIG. 3. The magnified view is that of FIG. 7.

As described above, the plasma display panel according to the present invention can adhere the film type front surface filter to a front surface of the panel to thereby obtain an effect of thinning, manufacture cost reduction and weight reduction. Further, the inventive plasma display panel can stably connect the filter support to the film type front surface filter.

The forgoing embodiment is merely exemplary and is not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A plasma display panel, comprising:
   a panel;
   a front surface filter disposed directly on a front surface of the panel to have a wider area than the panel;
   a back cover disposed at a rear surface of the panel;
   a filter support for electrically connecting the front surface filter with the back cover;
   a support member disposed to encompass a portion of the front surface filter and the filter support, and connected to the back cover; and
   a metallic layer formed on an extending portion of the front surface filter, wherein the extending portion does not overlap with the panel and is located between the filter support and the support member.

2. The plasma display panel of claim 1, wherein the metallic layer is formed between the filter support and the support member.

3. The plasma display panel of claim 2, wherein the metallic layer is electrically connected with the front surface filter and the filter support.

4. The plasma display panel of claim 2, wherein the filter support has a plurality of protrusions on a surface connected with the metallic layer.

5. The plasma display panel of claim 2, wherein the metallic layer, the filter support and the support member respectively have at least one hole and a screw disposed to pass through the hole such that the metallic layer, the filter support and the support member being fixed to one another.

6. The plasma display panel of claim 1, wherein the filter contacts the panel such that the filter is provided on the panel.

7. The plasma display panel of claim 1, wherein the extending portion does not overlap with the panel.

8. The plasma display panel of claim 1, wherein the front surface filter does not include a glass layer.

9. The plasma display panel of claim 1, wherein the front surface filter is formed from multiple layers and wherein the filter support is located between all layers of the front surface filter and the back cover.

10. The plasma display panel of claim 9, wherein the metallic layer is not included in the layers of the front surface filter.

11. The plasma display panel of claim 10, wherein the metallic layer does not overlap the panel.

12. The plasma display panel of claim 1, wherein the metallic layer does not overlap the panel.

13. The plasma display panel of claim 1, wherein the metallic layer is separate from the front surface filter.

14. The plasma display panel of claim 1, wherein the filter support is not connected to the support member.

15. The plasma display panel of claim 1, wherein the front surface filter is a film-type filter.

16. The plasma display panel of claim 1, wherein the extending portion of the front surface filter has a first width and the metallic layer has a second width less than the first width.

17. A plasma display panel, comprising:
    a panel having an upper substrate and a lower substrate for displaying an image;
    a front surface filter formed directly on a front surface of the panel;
    a back cover spaced from and disposed in a backward portion of the panel to cover the backward portion of the panel;
    a front cover spaced from and disposed in a forward portion of the front surface filter to cover at least part of the front surface filter;
    a filter support, disposed between the front surface filter and the front cover, to physically support the front surface filter and electrically connect the front surface filter with at least one of the back cover or the front cover; and
    a first conductive layer formed between the end portion of the front surface filter and the filter support to electrically connect the front surface filter and the filter support.

18. The plasma display panel as claimed in claim 17, wherein the first conductive layer comprises a metallic mesh layer.

19. The plasma display panel as claimed in claim 17, wherein the first conductive layer comprises an EMI shielding layer.

20. The plasma display as claimed in claim 17, wherein a second conductive layer is further disposed between the first conductive layer and the filter support.

21. The plasma display panel as claimed in claim 17, wherein the front surface filter comprises at least one member selected from a group of an AR layer, a NIR layer, a light characteristic film, and a NIR shield film.

22. The plasma display panel as claimed in claim 17, wherein a second conductive layer comprises at least one of a fringe spring gasket or a shielding foam gasket.

23. The plasma display panel as claimed in claim 17, wherein the front surface filter does not include a glass layer.

24. The plasma display panel of claim 17, wherein the front surface filter is a film-type filter.

25. The plasma display panel, comprising:
   a panel having an upper substrate and a lower substrate;
   a front surface filter disposed directly on a front surface of the panel, the front surface filter having a wider area than that of the so that the front surface filter has an extended portion in at least part thereof beyond the edges of the panel;
   a back cover spaced from and disposed in a backward portion of the panel to cover the backward portion of the panel;
   a filter support disposed between the front surface filter and the back cover to physically support the front surface filter and electrically connect the front surface filter with the back cover; and
   a first conductive layer formed between the extended portion of the front surface filter and the filter support to electrically connect the front surface filter and the filter support.

26. The plasma display panel as claimed in claim 25, wherein the plasma display panel further comprise a front cover spaced from and disposed in a forward portion of the front surface filter to cover at least part of the front surface filter.

27. The plasma display panel as claimed in claim 26, wherein the extended portion of the front surface filter is connected with the front cover.

28. The plasma display panel as claimed in claim 27, wherein a second conductive layer is further disposed between the extended portion of the front surface filter and the front cover.

29. The plasma display panel as claimed in claim 27, wherein a second conductive layer comprises at least one of a fringe spring gasket or a shielding foam gasket.

30. The plasma display panel as claimed in claim 27, wherein the filter support has a plurality of protrusions on a surface thereof which is contacted with the first conductive layer.

31. The plasma display panel as claimed in claim 30, wherein the plasma display panel further comprises at least one fastener means for physically connecting the front cover and the filter support with the front surface filter.

32. The plasma display panel as claimed in claim 31, wherein the fastener means comprises at least one screw and hole through which the screw is inserted.

33. The plasma display panel as claimed in claim 25, wherein the first conductive layer comprises an EMI shielding layer of the front surface filter.

34. The plasma display panel as claimed in claim 33, wherein the EMI shielding layer comprises a metallic mesh layer.

35. The plasma display panel as claimed in claim 25, wherein the front surface filter comprises at least one member selected from a group of an AR layer, a NIR layer, a light characteristic film, and a NIR shield film.

36. The plasma display panel as claimed in claim 25, wherein the front surface filter does not include a glass layer.

37. The plasma display panel of claim 25, wherein the filter contacts the panel such that the filter is provided on the panel.

38. The plasma display panel of claim 25, wherein the front surface filter is a film-type filter.

39. A plasma display panel, comprising:
   a panel;
   a front surface filter formed directly on a front surface of the panel;
   a first metallic layer formed on a prescribed area of a front surface of the front surface filter;
   a back cover disposed at a rear surface of the panel;
   a front cover disposed at die front surface of the front surface filter; and
   a filter support formed on a front surface of the first metallic layer for electrically connecting the front surface filter with the back cover or the front cover, wherein the filter support is disposed between the front surface filter and the front cover.

40. The plasma display panel of claim 39, wherein the first metallic layer is further formed on a lateral face of the front surface filter.

41. The plasma display panel of claim 39, wherein a second metal layer is further disposed between the first metal layer and the filter support.

42. The plasma display panel of claim 39, wherein the front surface filter is a film type front surface filter.

43. The plasma display panel of claim 39, wherein the prescribed area corresponds to an area not overlapping with the panel.

44. The plasma display panel of claim 39, wherein the front surface filter does not include a glass layer.

45. A plasma display panel, comprising:
   a panel;
   a front surface filter formed directly on a front surface of the panel;
   a metallic layer formed on a prescribed area of a front surface, a rear surface, and a lateral face of the front surface filter;
   a back cover disposed at a rear surface of the panel;
   a front cover disposed at the front surface of the front surface filter; and
   a filter support formed on the metallic layer for electrically connecting the front surface filter with the back cover or the front cover, wherein the filter support is disposed between the front surface filter and the front cover.

46. The plasma display panel of claim 45, wherein the front surface filter is a film type front surface filter.

47. The plasma display panel of claim 45, wherein the prescribed area corresponds to an area not overlapping with the panel.

48. The plasma display panel of claim 45, wherein the front surface filter does not include a glass layer.

* * * * *